United States Patent
Hoinkis et al.

(10) Patent No.: US 9,484,220 B2
(45) Date of Patent: Nov. 1, 2016

(54) SPUTTER ETCH PROCESSING FOR HEAVY METAL PATTERNING IN INTEGRATED CIRCUITS

(71) Applicants: International Business Machines Corporation, Armonk, NY (US); Applied Materials, Incorporated, Santa Clara, CA (US)

(72) Inventors: Mark D. Hoinkis, Fishkill, NY (US); Eric A. Joseph, White Plains, NY (US); Hiroyuki Miyazoe, White Plains, NY (US); Chun Yan, San Jose, CA (US)

(73) Assignees: International Business Machines Corporation, Armonk, NY (US); Applied Materials, Incorporated, Santa Clara, CA (US)

( * ) Notice: Subject to any disclaimer, the term of this patent is extended or adjusted under 35 U.S.C. 154(b) by 29 days.

(21) Appl. No.: 13/836,739

(22) Filed: Mar. 15, 2013

(65) Prior Publication Data

US 2014/0264861 A1 Sep. 18, 2014

(51) Int. Cl.
H01L 21/32 (2006.01)
H01L 21/3213 (2006.01)
H01L 21/768 (2006.01)

(52) U.S. Cl.
CPC ... *H01L 21/32136* (2013.01); *H01L 21/32139* (2013.01); *H01L 21/76852* (2013.01); *H01L 21/76885* (2013.01)

(58) Field of Classification Search
CPC . H01L 21/32136; H01L 43/12; H01L 21/32; H01L 21/302; H01L 21/306
USPC ...... 257/741, E43.006; 438/720, 3, 216, 337
See application file for complete search history.

(56) References Cited

U.S. PATENT DOCUMENTS

| | | | | |
|---|---|---|---|---|
| 5,240,554 A | * | 8/1993 | Hori | H01L 21/3081 257/E21.232 |
| 5,795,458 A | * | 8/1998 | Miyoshi | H01L 21/0337 205/122 |
| 6,399,508 B1 | | 6/2002 | Ting et al. | |
| 7,037,849 B2 | | 5/2006 | Chiu et al. | |
| 7,118,959 B2 | | 10/2006 | Wofford et al. | |
| 7,192,880 B2 | | 3/2007 | Dostalik, Jr. | |
| 7,262,127 B2 | | 8/2007 | Ishikawa | |
| 7,579,613 B2 | | 8/2009 | Lung et al. | |
| 2004/0026369 A1 | * | 2/2004 | Ying | B82Y 40/00 216/63 |
| 2005/0009358 A1 | * | 1/2005 | Choi | H01L 21/28123 438/706 |
| 2007/0262417 A1 | | 11/2007 | Ohtake et al. | |
| 2012/0028373 A1 | * | 2/2012 | Belen | H01L 43/12 438/3 |
| 2012/0171840 A1 | | 7/2012 | Cho et al. | |

* cited by examiner

*Primary Examiner* — David Vu
*Assistant Examiner* — Mouloucoulaye Inoussa
(74) *Attorney, Agent, or Firm* — Louis Percello

(57) ABSTRACT

A method for fabricating one or more conductive lines in an integrated circuit includes providing a layer of copper containing conductive metal in a multi-layer structure fabricated upon a wafer, providing a first hard mask layer over the layer of copper containing conductive metal, performing a first sputter etch of first hard mask layer using a chlorine-based plasma or a sulfur fluoride-based plasma, and performing a second sputter etch of first hard mask layer using a second plasma, wherein a portion of the layer of copper containing conductive metal residing below a portion of the first hard mask layer that remains after the second sputter etch forms the one or more conductive lines. In one embodiment, the second plasma is a fluorocarbon-based plasma.

24 Claims, 7 Drawing Sheets

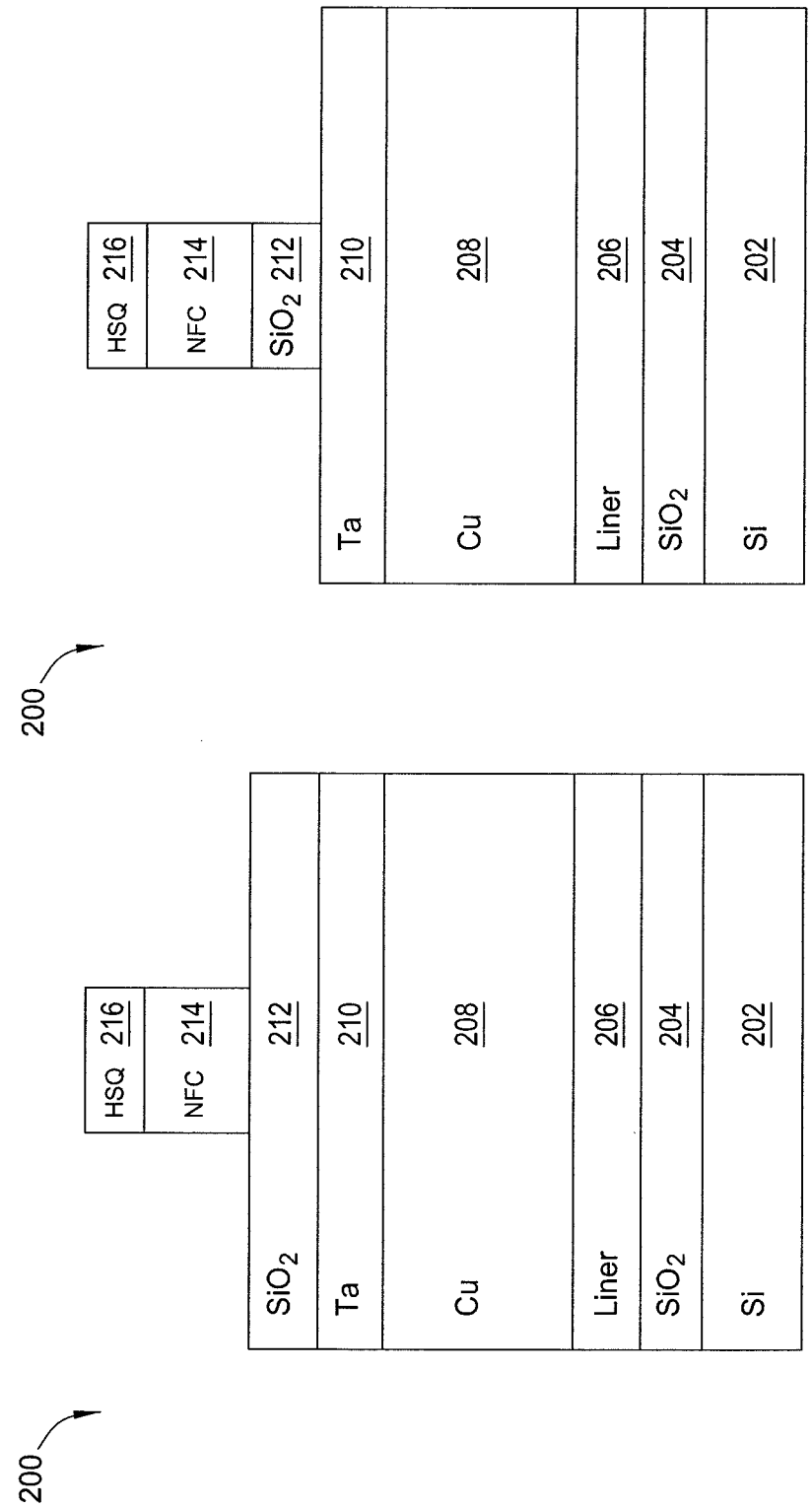

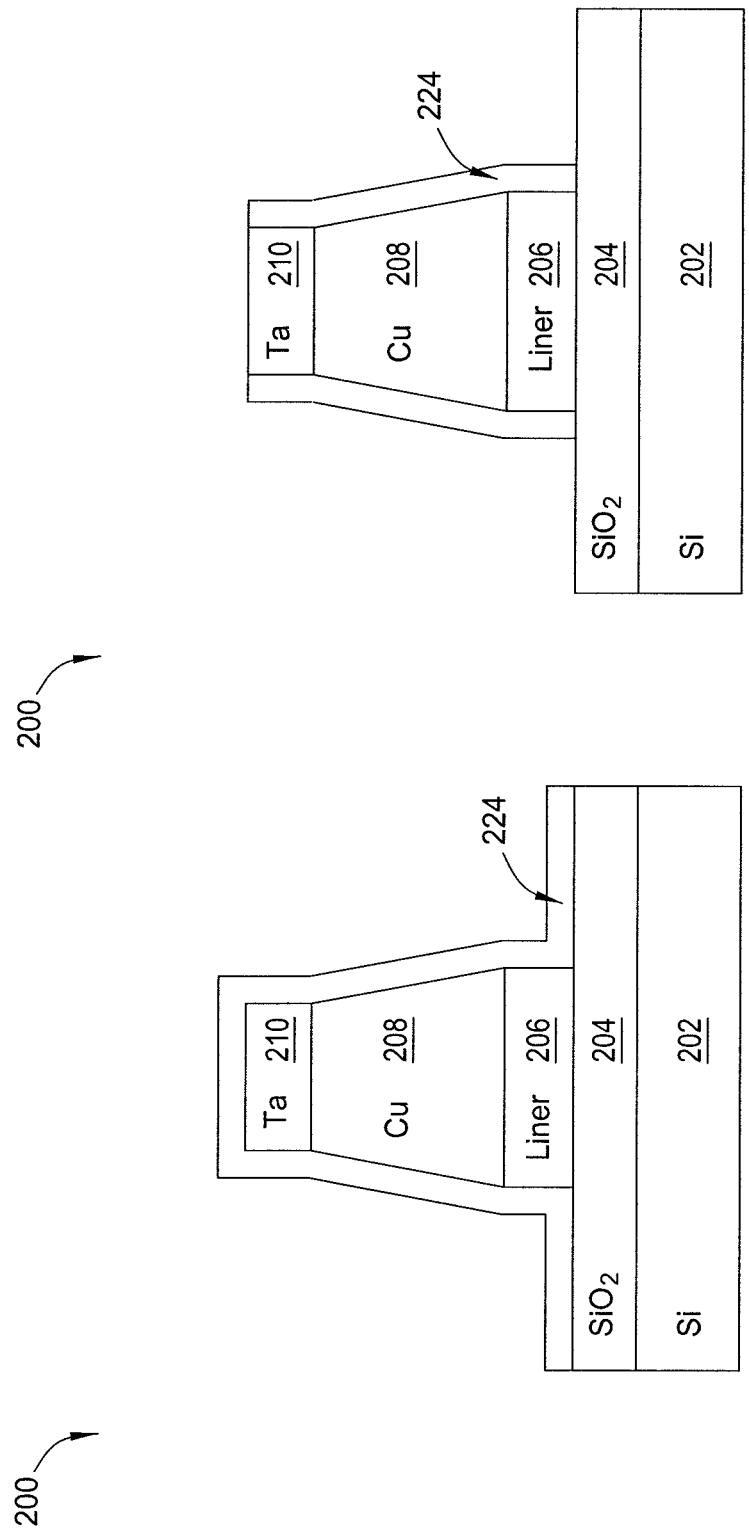

SPUTTER ETCH PROCESSING FOR HEAVY METAL PATTERNING IN INTEGRATED CIRCUITS

BACKGROUND OF THE INVENTION

The present invention relates generally to integrated circuits and relates more specifically to metal patterning processes for use in manufacturing integrated circuits.

Integrated circuits (ICs) commonly use copper interconnects (or "lines") to connect transistors and other semiconductor devices on the ICs. These interconnects are typically fabricated using an additive damascene process in which an underlying insulating layer (e.g., silicon oxide) is patterned with open trenches. FIG. 1, for example, is a schematic diagram illustrating a trench 100 that may be formed in the insulating layer during IC fabrication. A subsequent deposition of copper on the insulating layer fills the trenches with copper. The copper is removed to the top of the insulating layer, but remains within the trenches to form a patterned conductor. Successive layers of insulator and copper are formed according to this damascene process, resulting in a multilayer copper interconnect structure.

Conventional damascene processing such as that described above is not always compatible with the trend toward smaller feature sizes in modern complementary metal-oxide-semiconductor (CMOS) technology. For instance, modern CMOS technology may require lines having widths of less than forty nanometers and aspect ratios (i.e., line height: line width) of approximately 2:1. Attempting conventional damascene processing within these parameters often results in poor liner/seed coverage on the walls of the trenches (e.g., as illustrated at 102 in FIG. 1), pinch off at the mouths of the trenches (e.g., as illustrated at 104), and reentrant reactive ion etching profiles (e.g., as illustrated at 106). Consequently, the copper filling the trenches is subject to voids, defects, and poor adhesion to the trench liners. Moreover, as the lines narrow in size, the resistivity of the copper is increased (due to, for example, the thickness of the liner relative to the thickness of the copper, the small copper grain size, and copper grain boundary and surface scattering phenomena), resulting in decreased IC performance.

SUMMARY OF THE INVENTION

A method for fabricating one or more conductive lines in an integrated circuit includes providing a layer of copper containing conductive metal in a multi-layer structure fabricated upon a wafer, providing a first hard mask layer over the layer of copper containing conductive metal, performing a first sputter etch of first hard mask layer using a chlorine-based plasma, and performing a second sputter etch of first hard mask layer using a second plasma, wherein a portion of the layer of copper containing conductive metal residing below a portion of the first hard mask layer that remains after the second sputter etch forms the one or more conductive lines.

Another embodiment of method for fabricating one or more conductive lines in an integrated circuit includes providing a layer of copper containing conductive metal in a multi-layer structure fabricated upon a wafer, providing a hard mask layer over the layer of conductive material, performing a first sputter etch of the hard mask layer using at least one of a chlorine-based plasma or a sulfur fluoride-based plasma, wherein the first sputter etch leaves at least a thin coating of the hard mask layer over the layer of copper containing conductive metal, performing a second sputter etch of the hard mask layer using a fluorocarbon-based plasma, wherein the second sputter etch removes the thin coating and exposes a portion of the layer of copper containing conductive metal, and patterning the portion of the layer of copper containing conductive metal to form the one or more conductive lines.

An integrated circuit includes a plurality of semiconductor devices and a plurality of conductive lines connecting the plurality of semiconductor devices, wherein at least some of the plurality of conductive lines are fabricated by providing a layer of copper containing conductive metal in a multi-layer structure fabricated upon a wafer, providing a hard mask layer over the layer of copper containing conductive metal, performing a first sputter etch of hard mask layer using a chlorine-based plasma, performing a second sputter etch of hard mask layer using a second plasma, and patterning a portion of the layer of copper containing conductive metal residing below a portion of the hard mask layer that remains after the second sputter etch to form the one or more conductive lines.

Another embodiment of a method for fabricating one or more conductive lines in an integrated circuit include providing a layer of copper containing conductive metal in a multi-layer structure fabricated upon a wafer, providing a hard mask layer over the layer of copper containing conductive metal, performing a first sputter etch of hard mask layer using a sulfur fluoride-based plasma, and performing a second sputter etch of hard mask layer using a second plasma, wherein a portion of the layer of copper containing conductive metal residing below a portion of the hard mask layer that remains after the second sputter etch forms the one or more conductive lines.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2J are schematic diagrams illustrating various stages of fabrication of a complementary metal-oxide-semiconductor device, according to embodiments of the present invention.

DETAILED DESCRIPTION

Figure 1:
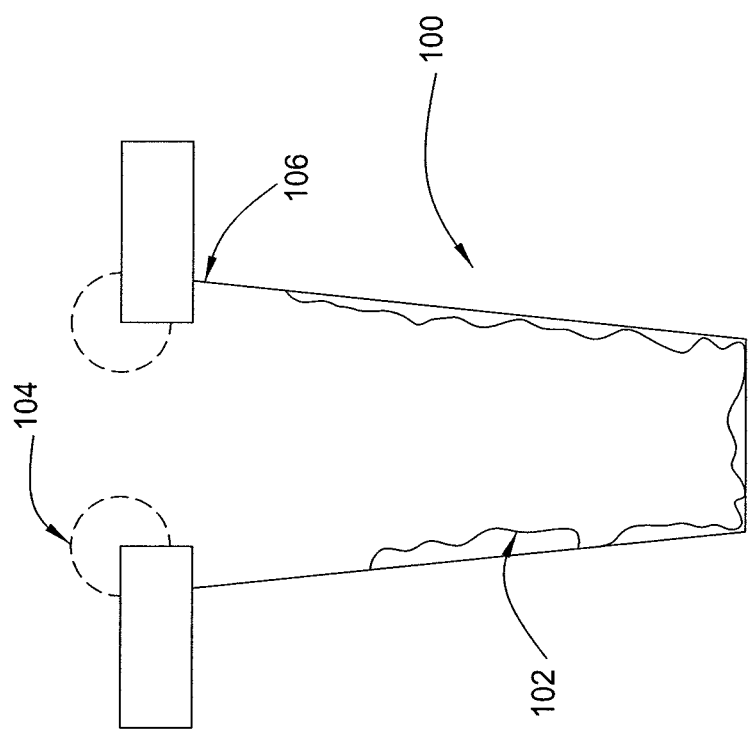
FIG. 1 is a schematic diagram illustrating a trench that may be formed during integrated circuit fabrication.

In one embodiment, the invention is a method and apparatus for heavy metal patterning using a sputter etch process. Embodiments of the invention pattern fine metal lines on an insulating layer of an integrated circuit via a subtractive process (i.e., a process that creates a desired structure by removing material rather than by adding material). In a particular embodiment, the subtractive process uses chlorine and fluorine etch chemistry in a two-step process to control the patterning of hard masks on copper containing conductive metal. In particular, the disclosed process allows for easier control of the hard mask profile during subtractive copper and copper alloy etching, as well as easier control of the copper patterning.

FIGS. 2A-2J are schematic diagrams illustrating various stages of fabrication of a complementary metal-oxide-semiconductor (CMOS) device 200, according to embodiments of the present invention. As such, FIGS. 2A-2J also collectively serve as a flow diagram illustrating portions of one embodiment of a method for fabricating the CMOS device 200, according to the present invention.

In particular, FIG. 2A illustrates the CMOS device 200 at an intermediate stage in the processing. For the purpose of clarity, several fabrication steps leading up to the production of the CMOS device 200 as illustrated in FIG. 2A are omitted. In other words, the CMOS device 200 does not start out in the form illustrated in FIG. 2A, but may develop into the illustrated structure over several well-known processing steps which are not illustrated but are well-known to those of skill in the art.

The CMOS device 200 generally comprises a plurality of layers at this intermediate stage in the processing, including: a silicon wafer 202, a first dielectric layer 204 (e.g., comprising silicon dioxide ($SiO_2$), silicon nitride ($Si_3N_4$), silicon oxynitride (SiON), or a low-k dielectric) formed on the silicon wafer 202, a first liner layer 206 (e.g., comprising tantalum (Ta), tantalum nitride (TaN), cobalt (Co), manganese (Mn), manganese oxides (MnOx), or manganese silicates (MnSixOy)) formed on the first dielectric layer 204, a conductive metal layer 208 (e.g., comprising copper (Cu), a copper alloy, gold (Au), nickel (Ni), cobalt (Co), or any other material that does not readily form a volatile species) formed on the first liner layer 206, a first hard mask layer 210 (e.g., comprising tantalum (Ta), niobium (Nb), or vanadium (V)) formed on the conductive metal layer 208, a second hard mask layer 212 (e.g., comprising $SiO_2$ or $Si_3N_4$) formed on the first hard mask layer 210, an organic underlayer 214 (e.g., comprising near frictionless carbon (NFC) or an organic planarizing layer (OPL)) formed on the second hard mask layer 212, and a photoresist or electron beam resist layer 216 (e.g., comprising hydrogen silsesquioxane (HSQ)) formed on the organic underlayer 214.

FIG. 2A illustrates the CMOS device 200 after a pattern of very small structures has been formed in the organic underlayer 214 and photoresist layer 216. In one embodiment, the organic underlayer 214 and photoresist layer 216 are patterned using a photolithography technique, such as optical lithography or direct write electron beam lithography. In one embodiment, the photolithography technique includes a negative resist that allows removal of the organic underlayer 214 and photoresist layer 216 down to the second hard mask layer 212, except for the portions of the organic underlayer 214 and photoresist layer 216 illustrated in FIG. 2A.

As illustrated in FIG. 2B, the pattern is transferred from the organic underlayer 214 and photoresist layer 216 to the second hard mask layer 212. In one embodiment, pattern transfer involves etching the second hard mask layer 212 down to the first hard mask layer 210 (e.g., using a dry etch process such as reactive ion etching). Pattern transfer results in portions of the second hard mask layer 212 being removed. For instance, in the embodiment illustrated in FIG. 2B, all portions of the second hard mask layer 212 except for the portions residing directly beneath the organic underlayer 214 and photoresist layer 216 are removed down to the first hard mask layer 210.

Figure 2D:
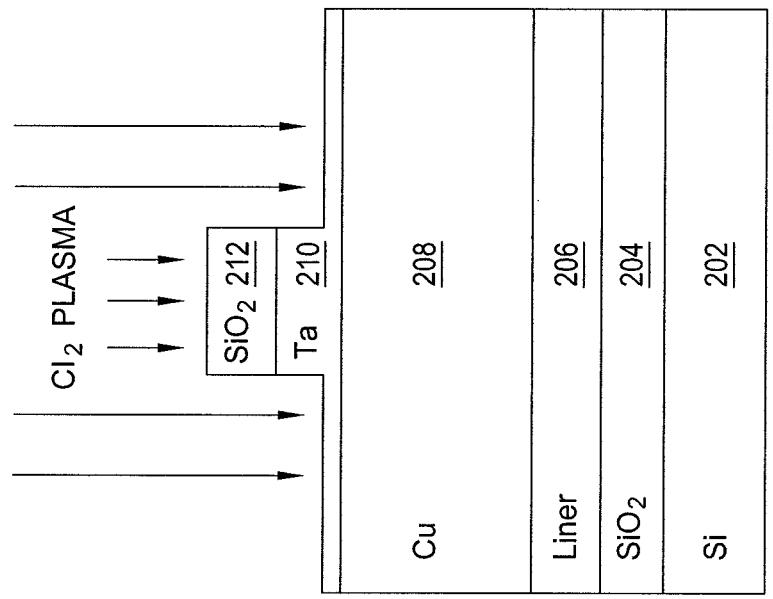
Figure 2C:
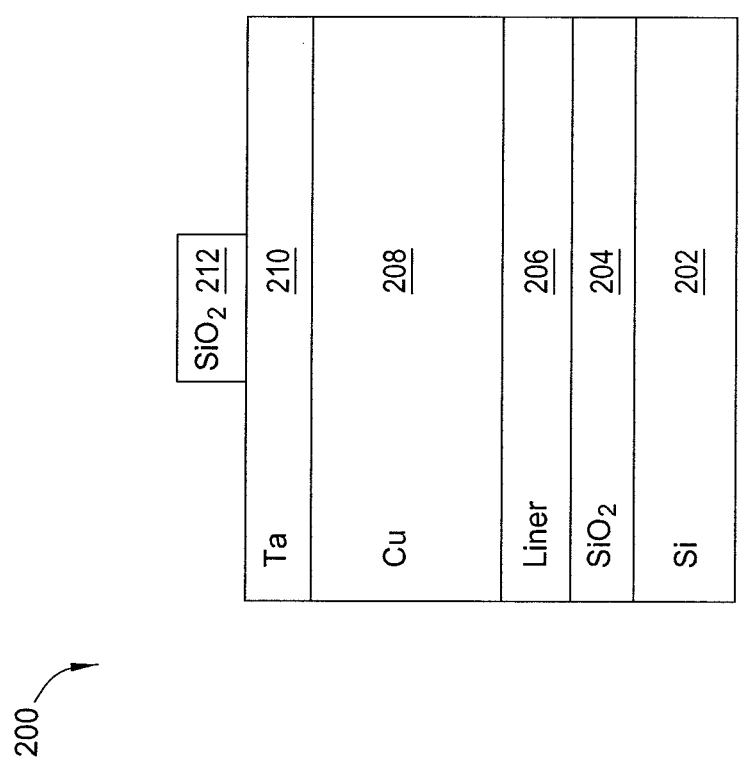
Figures 2E, 2F:
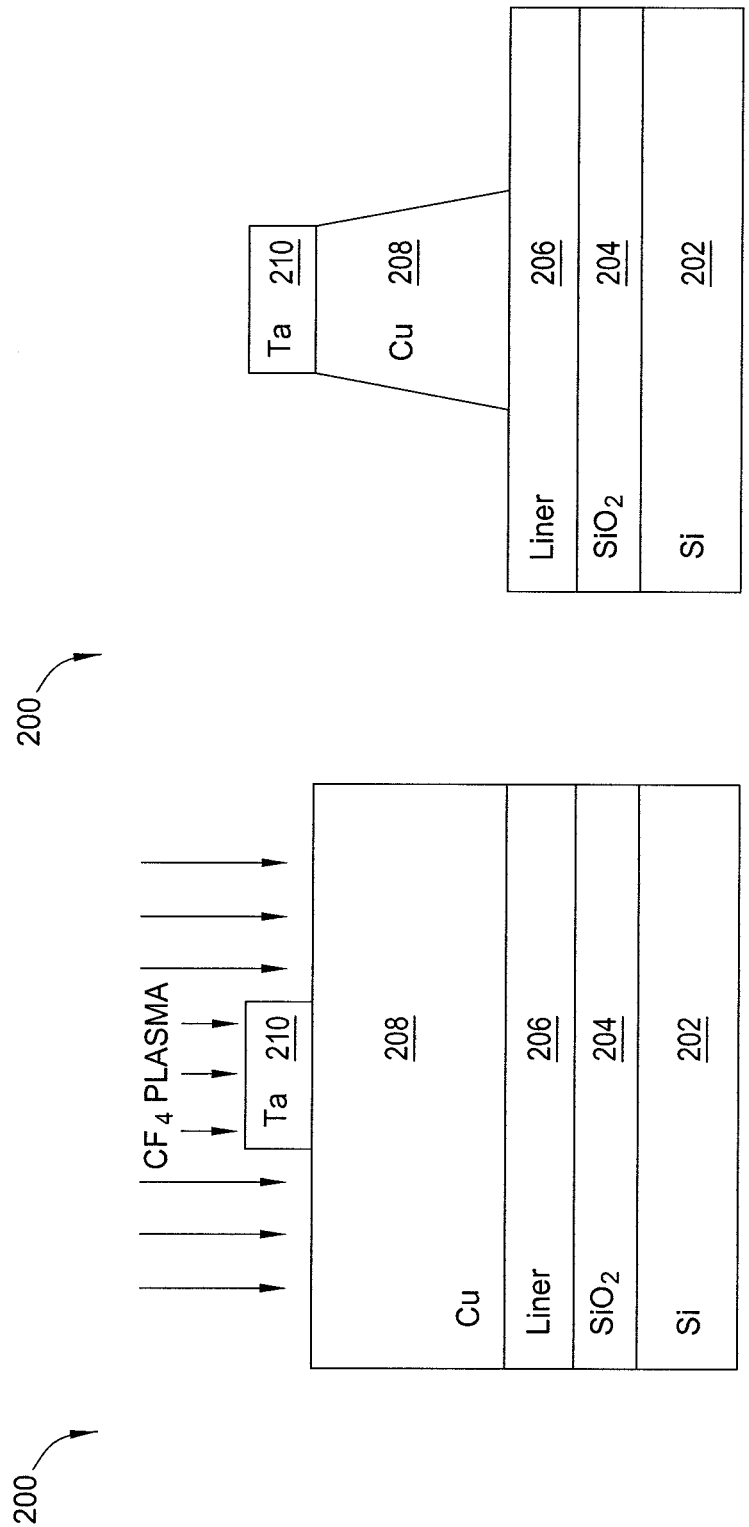

As illustrated in FIG. 2C, the organic underlayer 214 and photoresist layer 216 are next removed down to the second hard mask layer 212, leaving the patterned second hard mask layer 212. As illustrated in FIGS. 2D-2E, a two-step etch process is next used to transfer the pattern from the second hard mask layer 212 to the first hard mask layer 210. In one embodiment, a first, chlorine-based plasma or sulfur fluoride-based plasma sputter etch process (e.g., using diatomic chlorine ($Cl_2$) plasma, chlorine and sulfur tetrafluoride ($SF_4$) plasma, chlorine and sulfur hexafluoride ($SF_6$) plasma, or another chlorine-based plasma or sulfur fluoride-based plasma) is used to remove a portion of the first hard mask layer 210, as illustrated in FIG. 2D. This can be achieved using any plasma system used for semiconductor device prototyping or fabrication. For instance, medium to high density (i.e., plasma densities>approximately $10^8$ $cm^{-3}$) and low electron temperature $T_e$ (i.e., $T_e$<approximately 10 eV) systems can be used; however, a high source density and low ion energy system will typically be used. Such systems include, but are not limited to: inductively coupled plasma (ICP) systems, electron cyclotron resonance (ECR) systems, helicon systems, dual frequency capacitive (DFC) systems, helical resonator systems, and microwave-generated discharge systems. Additionally, low ion energies are characterized by any of the above-described systems in which radio frequency (RF) power is coupled to the platen/substrate using frequencies less than approximately 100 MHz and power less than approximately 2000 W.

In the embodiment illustrated in FIG. 2D, the first sputter etch step results in the first hard mask layer 210 being etched a portion of the way down to the conductive metal layer 208; however, at least a thin coating of the first hard mask layer 210 remains over the regions of the conductive metal layer 208 that do not reside directly beneath the remaining portion of the second hard mask layer 212. In one embodiment, the first sputter etch step etches the first hard mask layer 210 at a first etch rate.

As illustrated in FIG. 2E, a second sputter etch step is performed using a second plasma chemistry. In one embodiment, the second plasma chemistry is a fluorocarbon-based plasma (e.g., using tetrafluoromethane ($CF_4$) or another fluorocarbon-based plasma). The second sputter etch/metal surface modification step removes the thin coating of the first hard mask layer 210 that remains after the first sputter etch step (i.e., the portions of the first hard mask layer 210 that do not reside directly beneath the second hard mask layer 212), thereby exposing the conductive metal layer 208. In one embodiment, the second sputter etch step etches the first hard mask layer 210 at a second etch rate different from the first etch rate (e.g., the second etch rate may be slower than the first etch rate). Thus, after the two-step plasma etch process (i.e., the first, chlorine-based plasma or sulfur fluoride-based plasma etch followed by the second, fluorocarbon-based plasma etch), the exposed portions of the first hard mask layer 210 are etched down to the conductive metal layer 208. In addition, the second sputter etch step completely etches/removes the second hard mask layer 212. The second sputter/metal surface modification etch step thus provides a soft landing for the etch of the conductive metal layer 208.

As illustrated in FIG. 2F, an etch process is next used to remove a portion of the conductive metal layer 208. In the embodiment illustrated in FIG. 2F, the conductive metal layer 208 is etched down to the first liner layer 206, except for the portions of the conductive metal layer 208 residing directly beneath the first hard mask layer 210. The remaining portions of the conductive metal layer 208 form one or more thin metal lines or interconnects. In one embodiment, each line has a shape in which the base 220 of the line is wider than the top 222 of the line (for instance, the base may be twice as wide as the top). Thus, each line may have a substantially pyramidal profile (having, for example, a sidewall taper of approximately eighty to ninety degrees). In a further embodiment, the height of each line is greater than the width of the line at its widest point (e.g., at least twenty percent greater than the width of the base).

Figure 2G:
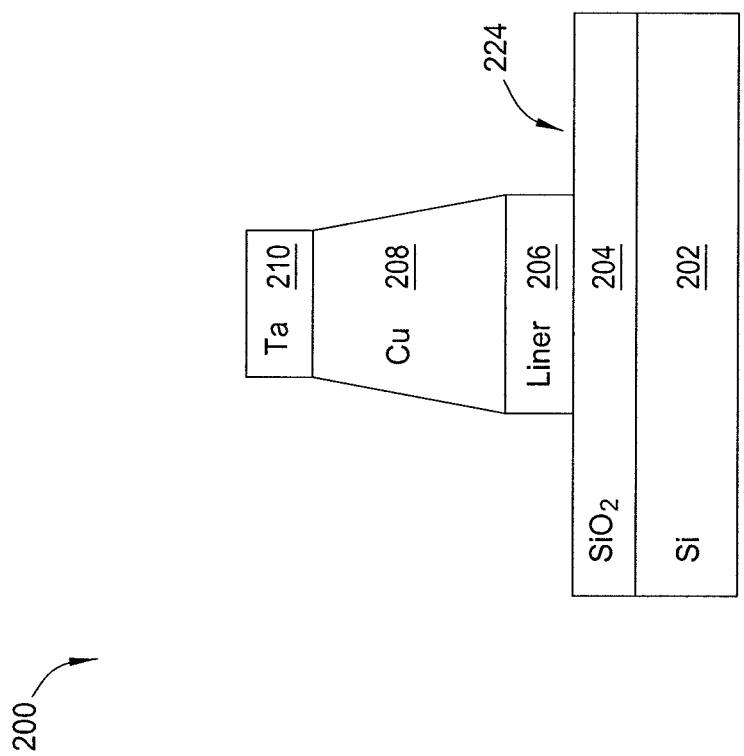

As illustrated in FIG. 2G, an etch process is used to remove a portion of the first liner layer 206. In the embodiment illustrated in FIG. 2G, the first liner layer 206 is etched down to the first dielectric layer 204, except for the portions of the first liner layer 206 residing directly beneath the conductive metal layer 208. The remaining portions of the first liner layer 206 form the bases of the "trenches" that immediately surround the conductive metal layer 208.

As illustrated in FIG. 2H, the sidewalls of the liners are formed by first depositing a second liner layer 224 (e.g., comprising TaN) over the CMOS device 200. The second liner layer 224 coats portions of the first dielectric layer 204, the first liner layer 206, the conductive metal layer 208, and the first hard mask layer 210. In one embodiment, the second liner layer 224 is deposited by atomic layer deposition.

As illustrated in FIG. 2I, a portion of the second liner layer 224 is next removed. In one embodiment, at least the portion of the second liner layer 224 that coats the first dielectric layer 204 is removed; the portions of the second liner layer 224 coating the first liner layer 206, the conductive metal layer 208, and the first hard mask layer 210 remain intact. In one embodiment, the portions of the second liner layer 224 are removed via an etch process, such as reactive ion etching.

Figure 2J:
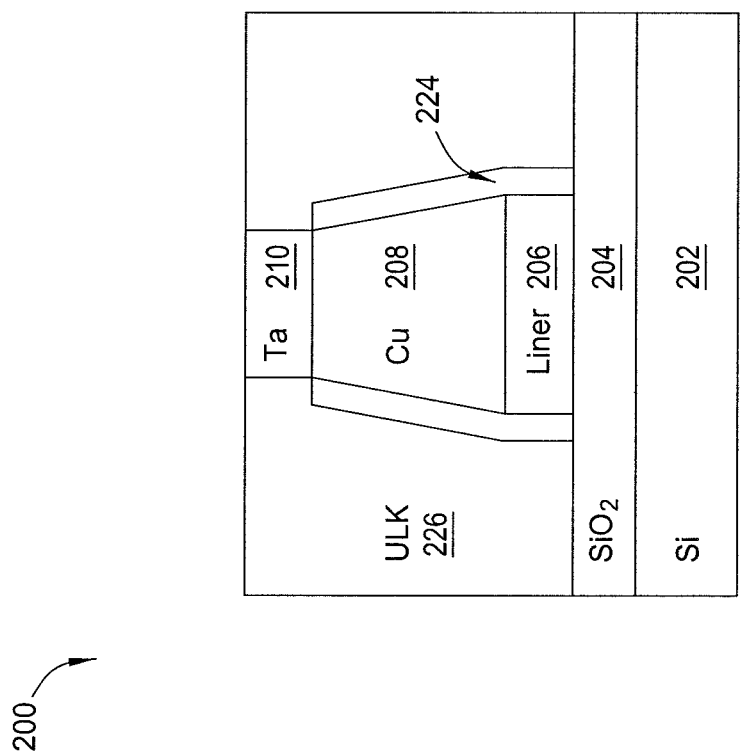

As illustrated in FIG. 2J, a second dielectric layer 226 (e.g., comprising a low-k dielectric material for which k<approximately 4.0) is next deposited over the CMOS device 200 and planarized. Specifically, the second dielectric layer 226 fills in the empty space in the CMOS device 200, coating portions of the first dielectric layer 204, the first liner layer 206, the second liner later 224, and first hard mask layer 210. The resultant structure thus includes one or more trenches (i.e., the interior volumes defined by the first liner layer 206 and the second liner layer 224, which collectively form a conformal liner for the trenches) containing fine metal lines (i.e., the conductive material layer 208).

The present invention thus enables the etch of copper containing metals to be better controlled during the fabrication of CMOS devices. In particular, the two-step plasma etch process (e.g., as described in connection with FIGS. 2D and 2E) allows for better control over the profile of the hard mask layers during etching and results in less damage to the conductive metal. The chlorine-based plasma or sulfur fluoride-based plasma etch controls the profile (e.g., height and sidewalls) of the hard mask layers; however, because chlorine and sulfur react readily with (e.g., cause erosion of) typical interconnect materials (e.g., copper), the subsequent fluorocarbon-based plasma etch is used to complete the etch while providing a soft landing on the conductive metal layer. Obtaining a good profile for the hard masks in turn enables better control of subsequent etching of the conductive metal, which can be controlled to produce interconnects having small features sizes (e.g., lines widths of less than forty nanometers). Such an approach may also be advantageous when patterning heavy metals on the conductive layer.

It is noted that although the above-described process includes the formation of conformal liners that line the metal interconnects, the CMOS device 200 could also be formed without the liners.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for fabricating one or more conductive lines in an integrated circuit, the method comprising:
   providing a layer of copper containing conductive metal in a multi-layer structure fabricated upon a wafer;
   providing a first hard mask layer over the layer of copper containing conductive metal;
   providing a second hard mask layer over the first hard mask layer;
   performing an etch of the second hard mask layer without etching the first hard mask layer, wherein the etch of the second hard mask layer leaves a portion of the second hard mask layer intact;
   performing a first sputter etch of first hard mask layer using a chlorine-based plasma, without completely removing the portion of the second hard mask layer; and
   performing a second sputter etch of the first hard mask layer immediately subsequent to performing the first sputter etch using a second plasma, wherein the second sputter etch removes the portion of the second hard mask layer, and wherein a portion of the layer of copper containing conductive metal residing below a portion of the first hard mask layer that remains after the second sputter etch forms the one or more conductive lines.

2. The method of claim 1, wherein the first sputter etch leaves a thin coating of the first hard mask layer over the layer of copper containing conductive metal.

3. The method of claim 2, wherein the second sputter etch removes the thin coating and exposes the layer of copper containing conductive metal.

4. The method of claim 1, wherein the second plasma comprises a fluorocarbon-based plasma.

5. The method of claim 1, wherein the fluorocarbon-based plasma comprises tetrafluoromethane plasma.

6. The method of claim 1, wherein the chlorine-based plasma comprises diatomic chlorine plasma.

7. The method of claim 1, wherein the first sputter etch additionally uses a sulfur fluoride-based plasma.

8. The method of claim 7, wherein the sulfur fluoride-based plasma comprises sulfur tetrafluoride.

9. The method of claim 7, wherein the sulfur fluoride-based plasma comprises sulfur hexafluoride.

10. The method of claim 1, wherein the first sputter etch is performed at a first etch rate, and the second sputter etch is performed at a second etch rate that avoids erosion of the copper containing conductive metal layer.

11. The method of claim 1, wherein the first hard mask layer comprises tantalum.

12. The method of claim 1, wherein each of the one or more conductive lines has a width of less than approximately forty nanometers.

13. The method of claim 1, further comprising:
   patterning the portion of the layer of copper containing conductive metal to form the one or more conductive lines.

14. A method for fabricating one or more conductive lines in an integrated circuit, the method comprising:
   providing a layer of copper containing conductive metal in a multi-layer structure fabricated upon a wafer;

providing a first hard mask layer over the layer of copper containing conductive material;

providing a second hard mask layer over the first hard mask layer;

performing an etch of the second hard mask layer without etching the first hard mask layer, wherein the etch of the second hard mask layer leaves a portion of the second hard mask layer intact;

performing a first sputter etch of the first hard mask layer using at least one of a chlorine-based plasma or a sulfur fluoride-based plasma, wherein the first sputter etch leaves at least a thin coating of the first hard mask layer over the layer of copper containing conductive metal without completely removing the portion of the second hard mask layer;

performing a second sputter etch of the first hard mask layer immediately subsequent to performing the first sputter etch using a fluorocarbon-based plasma, wherein the second sputter etch removes the portion of the second hard mask layer, and wherein the second sputter etch removes the thin coating and exposes a portion of the layer of copper containing conductive metal; and patterning the portion of the layer of copper containing conductive metal to form the one or more conductive lines.

15. The method of claim 14, wherein the fluorocarbon-based plasma comprises tetrafluoromethane plasma.

16. The method of claim 14, wherein the chlorine-based plasma comprises diatomic chlorine plasma.

17. The method of claim 14, wherein the sulfur fluoride-based plasma comprises sulfur tetrafluoride plasma.

18. The method of claim 14, wherein the sulfur fluoride-based plasma comprises sulfur hexafluoride plasma.

19. The method of claim 14, wherein the first sputter etch is performed at a first etch rate, and the second sputter etch is performed at a second etch rate that avoids erosion of the copper containing conductive metal layer.

20. A method for fabricating one or more conductive lines in an integrated circuit, the method comprising:

providing a layer of copper containing conductive metal in a multi-layer structure fabricated upon a wafer;

providing a first hard mask layer over the layer of copper containing conductive metal;

providing a second hard mask layer over the first hard mask layer;

performing an etch of the second hard mask layer without etching the first hard mask layer, wherein the etch of the second hard mask layer leaves a portion of the second hard mask layer intact;

performing a first sputter etch of the first hard mask layer using a sulfur fluoride-based plasma, without completely removing the portion of the second hard mask layer; and performing a second sputter etch of the first hard mask layer immediately subsequent to performing the first sputter etch using a second plasma, wherein the second sputter etch removes the portion of the second hard mask, and wherein a portion of the layer of copper containing conductive metal residing below a portion of the first hard mask layer that remains after the second sputter etch forms the one or more conductive lines.

21. The method of claim 20, wherein the sulfur fluoride-based plasma comprises sulfur tetrafluoride plasma.

22. The method of claim 20, wherein the sulfur fluoride-based plasma comprises sulfur hexafluoride plasma.

23. The method of claim 20, wherein the second plasma comprises a fluorocarbon-based plasma.

24. The method of claim 23, wherein the fluorocarbon-based plasma comprises tetrafluoromethane plasma.

* * * * *